United States Patent
Zhou et al.

(10) Patent No.: US 10,068,044 B1
(45) Date of Patent: Sep. 4, 2018

(54) SYSTEM AND METHOD FOR EFFICIENT DEVICE TESTING AND VALIDATION OF FAST TRANSIENTS

(71) Applicant: CADENCE DESIGN SYSTEMS, INC., San Jose, CA (US)

(72) Inventors: Yinghong Zhou, San Jose, CA (US); Ilya Yusim, San Jose, CA (US); Joel Phillips, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/384,152

(22) Filed: Dec. 19, 2016

(51) Int. Cl.
*G06F 17/50* (2006.01)

(52) U.S. Cl.
CPC ...... *G06F 17/5045* (2013.01); *G06F 17/5031* (2013.01)

(58) Field of Classification Search
CPC ............ G06F 17/5045; G06F 17/5036; G06F 17/5022; G06F 17/5031
See application file for complete search history.

(56) References Cited

U.S. PATENT DOCUMENTS

| | | | |
|---|---|---|---|
| 7,243,313 B1* | 7/2007 | Qin | G06F 17/5036 716/113 |
| 7,774,174 B2* | 8/2010 | Sheehan | G06F 17/5036 703/14 |
| 8,065,129 B1* | 11/2011 | Rahmat | G06F 17/5036 703/14 |
| 2004/0049746 A1* | 3/2004 | Rao | G06F 17/5036 716/113 |
| 2014/0324398 A1* | 10/2014 | Gullapalli | G06F 17/5022 703/2 |

* cited by examiner

*Primary Examiner* — Nha Nguyen
(74) *Attorney, Agent, or Firm* — Eric L. Sophir; Dentons US LLP

(57) ABSTRACT

The time to test integrated circuits is increasing as a function of the complexity of integrated circuits and processes used to fabricate the integrated circuits. Embodiments of this disclosure include systems and methods for reducing the time to integrated circuits by reducing the number of devices individually modeled. Embodiments can reduce the number of modeled devices by combining two or more devices into a single combined device that models all discrete devices, but in a reduced form.

20 Claims, 5 Drawing Sheets

SYSTEM AND METHOD FOR EFFICIENT DEVICE TESTING AND VALIDATION OF FAST TRANSIENTS

TECHNICAL FIELD

This disclosure relates to integrated circuit design and validation. Embodiments can be implemented during various stages of validation to test the design, behavior, and architecture of integrated circuits.

BACKGROUND

Design of integrated circuits goes through several phases. Phases include planning basic features and architecture, logical design and simulation, physical design and simulation, emulation, and fabrication. Logical design and simulation validate the architecture of the integrated circuit. Physical design and simulation validate the layout and physical characteristics of a device, including whether parasitic features, such as inductance, resistance, and capacitance, affect a design in unanticipated ways. It can be expensive to fabricate semiconductors only to determine that the fabricated device does not work. Therefore, engineers simulate integrated circuits prior to fabrication to resolve as many problems as possible before initial fabrication and testing of the fabricated device. As semiconductors become more complicated, simulations similarly become more complicated, and computer processing power is not growing as quickly as the complexity of integrated circuits is. Furthermore, smaller integrated circuits have larger parasitic effects, and devices in integrated circuits are getting smaller and smaller. Therefore, simulation times are increasing along with increased device complexity and decreasing device sizes.

SUMMARY

In large-scale simulations of integrated circuits, simulation requires additional time based on the number of nodes requiring simulation via a circuit-level matrix. The matrix size is directly proportional to the number of nodes. One reason for a slower matrix factorization may be that the matrix size is very large. In modern processes, parasitic elements on MOS device terminals (resistors in particular) may impact the semiconductor device behavior. These parasitic elements are part of the semiconductor device model itself and are intertwined with the nonlinear charge/current modeling. Internal nodes of integrated circuits sometimes can contribute more than 80% of the total circuit equations, resulting in large matrices and solution vectors. Slowdowns in overall analysis time associated with simulating every node can be a factor of two to four times. If these parasitic elements are removed entirely, unacceptable accuracy losses occur in the simulation such that the simulation is not representative of performance in the physical world. This situation can be expected to become worse over time as the complexity of integrated circuits increases.

Embodiments include testing systems and methods to reduce simulation time by reducing the number of calculations required to perform a simulation. Simulations determine parasitic contributions of one or more devices in an integrated circuit. Devices can include different types of elementary components, such as transistors, resistors, batteries, antennas, capacitors, and inductors. Each of these components has inherent parasitic contributions to integrated circuits. For instance, each of these devices has internal resistances and capacitances, which can at least partially be modeled with using the RC time constant ($\pi$=RC). Embodiments include reducing the number of discrete components by combining them into a combined device that models the operation of the discrete components that were combined. The discrete components may be combined from a single MOS device, a plurality of MOS devices, as well as their parasitics and the parasitics connecting them. Embodiments can also include reducing a single MOS device into a combined device. For example, a transistor MOS device can have several parasitic effects at different locations, e.g., source, drain, and gate. Each of these locations can have separate transfer functions that can be reduced into a combined transfer function. Various methods can be used to combine the characteristics of the discrete components. Each of these methods reduces the number of internal nodes. For example, internal nodes can be reduced to only external terminal nodes, which would be simulated.

Combining discrete components into a combined device can create significant efficiencies in simulation. Rather than model each discrete component, the testing system and method can model each combined device, resulting in a reduction in the number of calculations required to perform a simulation and, therefore, a large reduction in time to run the simulation. Due to the ever increasing complexity of integrated circuits, these reductions and savings can result in substantially faster development cycles, which may be imperative for engineering companies' time to market.

In one embodiment, a method of reducing the number of discrete components of an integrated circuit comprises selecting, by a processor, a subset of discrete components in an integrated circuit comprising a plurality of subsets of discrete components; determining, by the processor, whether the subset of discrete components is reducible to a combined device based on one or more predefined criteria; reducing, by the processor, the subset of discrete components into a combined device when the subset of discrete components is reducible; and generating, by the processor, one or more outputs of the combined device and parasitic contributions of the combined device to the integrated circuit.

In another embodiment, a method of reducing the number of discrete components of an integrated circuit comprises determining, by a processor, using one or more first predefined criteria, for a plurality of groups of discrete components, whether each group of discrete components may be reduced into a respective combined device; setting, by the processor, at least one flag identifying that the group of discrete components may be reduced into a combined device, if the group of discrete components meets the one or more first predefined criteria; formulating, by the processor, a plurality of ordinary differential equations to model each discrete component of the integrated circuit; discretizing, by the processor, each of the plurality of ordinary differential equations for a plurality of time periods, wherein for each of the plurality of time periods: selecting, by the processor, for each of a second plurality of groups of discrete components, a current group of discrete components; linearizing, by the processor, the plurality of ordinary differential equations that model the behavior of the current group of discrete components; determining, by the processor, using one or more second predefined criteria, whether the current group of discrete components may be reduced into a combined, current device; wherein, when the current group of discrete components meets the one or more second predefined criteria: reducing, by processor, the current group of discrete components into a combined, current device; and generating, by the processor, one or more outputs of the combined, current device.

In yet another embodiment, a computer program product embodied on a non-transitory computer readable medium, wherein the computer program product has instructions that when executed by a processor perform a method comprising selecting a subset of discrete components in an integrated circuit, wherein the integrated circuit comprises a plurality of subsets of discrete components; determining whether the subset of discrete components is reducible to a combined device based on one or more predefined criteria; reducing the subset of discrete components into a combined device when the subset of discrete components is reducible; and generating one or more outputs of the combined device and parasitic contributions of the combined device to the integrated circuit.

In another embodiment, a system for reducing a number of discrete components of an integrated circuit comprises a server comprising a processor configured to: select a subset of discrete components in an integrated circuit, wherein the integrated circuit comprises a plurality of subsets of discrete components; determine whether the subset of discrete components is reducible to a combined device based on one or more predefined criteria; reduce the subset of discrete components into the combined device when the subset of discrete components is reducible; and generate one or more outputs of the combined device and parasitic contributions of the combined device to the integrated circuit.

BRIEF DESCRIPTION OF THE DRAWINGS

Non-limiting embodiments of the present disclosure are described by way of example with reference to the accompanying figures which are schematic and are not intended to be drawn to scale. Unless indicated as representing the background art, the figures represent aspects of the disclosure.

DETAILED DESCRIPTION

Figure 1:
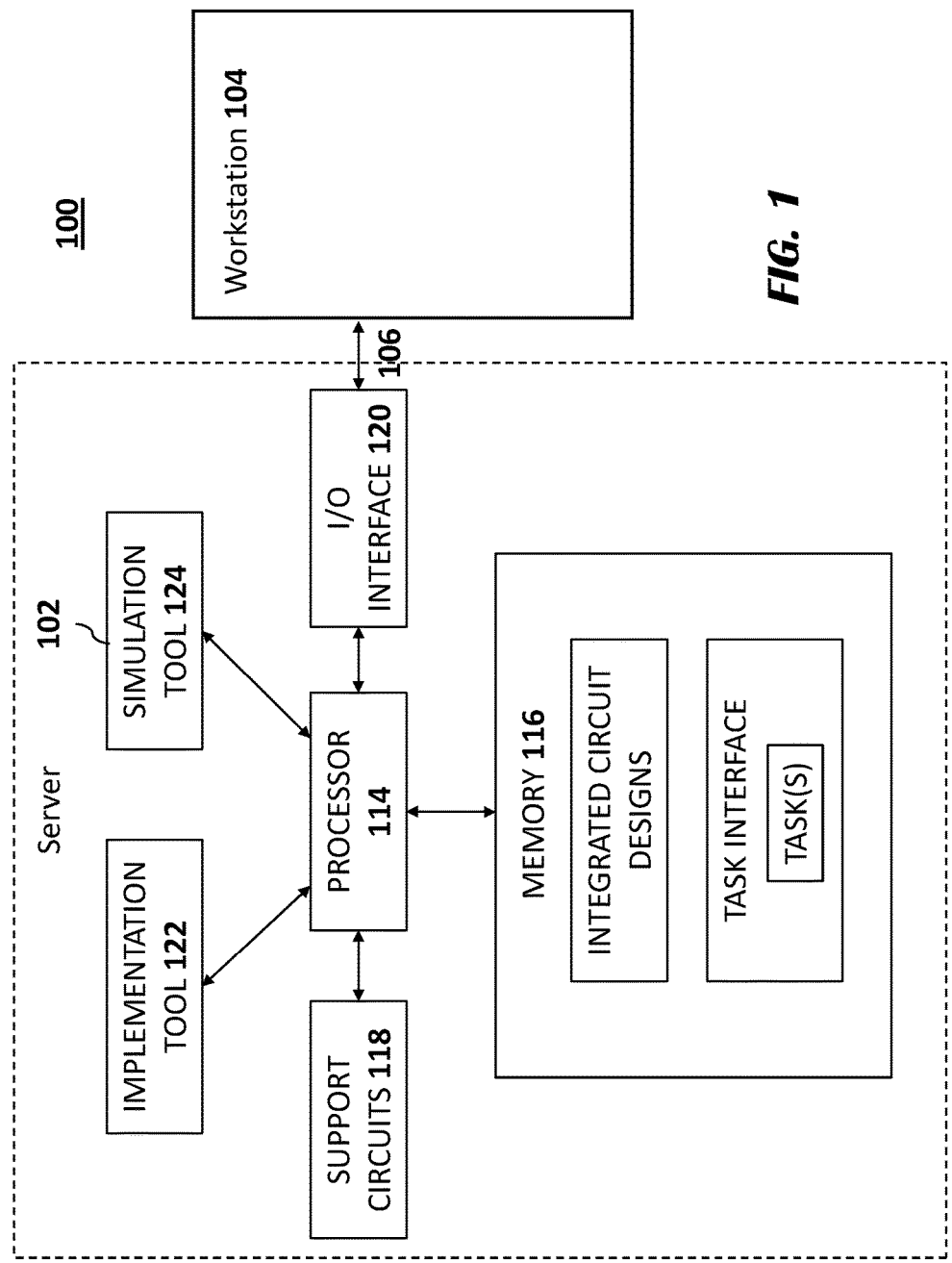
FIG. 1 illustrates a testing system, according to an exemplary embodiment.

The present disclosure is here described in detail with reference to embodiments illustrated in the drawings, which form a part here. Other embodiments may be used or other changes may be made without departing from the spirit or scope of the present disclosure. The illustrative embodiments described in the detailed description are not meant to be limiting of the subject matter presented here.

Various embodiments will now be described in further detail. The following description provides specific details for a thorough understanding and enabling description of these embodiments. One skilled in the relevant art will understand, however, that the embodiments discussed herein may be practiced without many of these details. Likewise, one skilled in the relevant art will also understand that the embodiments can include many other obvious features not described in detail herein. Additionally, some well-known structures or functions may not be shown or described in detail below, to avoid unnecessarily obscuring the relevant description.

The terms "connected" or "coupled" and related terms used throughout the description are used in an operational sense and are not necessarily limited to a direct physical connection or coupling. Thus, for example, two devices may be coupled directly, or via one or more intermediary media or devices. As another example, devices may be coupled in such a way that information can be passed there-between, while not sharing any physical connection with one another. Based on the disclosure provided herein, one of ordinary skill in the art will appreciate a variety of ways in which connection or coupling exists in accordance with the aforementioned definition.

The phrases "in some embodiments," "according to some embodiments," "in the embodiments shown," "in other embodiments," and the like generally mean the particular feature, structure, or characteristic following the phrase is included in at least one implementation of the disclosed technology, and may be included in more than one implementation. In addition, such phrases do not necessarily refer to the same embodiments or different embodiments.

The term "cause" and variations thereof, as used throughout this description, refers to either direct causation or indirect causation. For example, a computer system can "cause" an action by sending a message to a second computer system that commands, requests or prompts the second computer system to perform the action. Any number of intermediary devices may examine and/or relay the message during this process. In this regard, a device can "cause" an action even though it may not be known to the device whether the action will ultimately be executed or completed.

Reference will now be made to the exemplary embodiments illustrated in the drawings, and specific language will be used here to describe the same. It will nevertheless be understood that no limitation of the scope of the disclosure is thereby intended. Alterations and further modifications of the inventive features illustrated here, and additional applications of the principles of the disclosures as illustrated here, which would occur to one skilled in the relevant art and having possession of this disclosure, are to be considered within the scope of the disclosure.

FIG. 1 illustrates a block diagram illustrating components of a testing system 100. The testing system 100 includes a server 102 coupled to the workstation 104 via the communication link 106. The communication link 106 comprises any type of bus or link for the transfer of data between the server 102 and the workstation 104. The server 102 may include a processor 114, a memory 116, various support circuits 118, and an I/O interface 120.

The processor 114 includes suitable logic, circuitry, and interfaces that are operable to execute one or more instructions to perform predetermined operations/tasks. The processor 114 can be realized through a number of processor technologies known in the art. The examples of the processor 114 include, but are not limited to, an x86 processor, an ARM processor, a Reduced Instruction Set Computing (RISC) processor, an Application-Specific Integrated Circuit (ASIC) processor, or a Complex Instruction Set Computing (CISC) processor. The processor 114 can include one or more integrated or discrete processors to be a multi-processor system, where the group of processors is referred to as a processor. In an embodiment, the processor 114 includes a Graphics Processing Unit (GPU) that executes the set of instructions to perform one or more processing operations.

The memory 116 stores a set of instructions, logic design of various integrated circuits, tasks, and other data. Some of the commonly known memory 116 implementations include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory. Further, the memory 116 includes the one or more instructions that are executable by the processor 114 to perform specific operations. One or more instructions stored in the memory 116 can enable the testing system 100 to perform the predetermined operations/tasks. The support circuits 118 for the processor 114 include conventional cache, power supplies, clock circuits, data registers, I/O interfaces, and the like. The I/O interface 120 may be directly coupled to the memory 116 or coupled through the processor 114. The I/O interface 120 may also be configured for communication with the workstation 104 via the communication link 106. The processor can be a single processor, multiple processors integrated on a single die, or several discrete processors on multiple dies.

Figure 2:
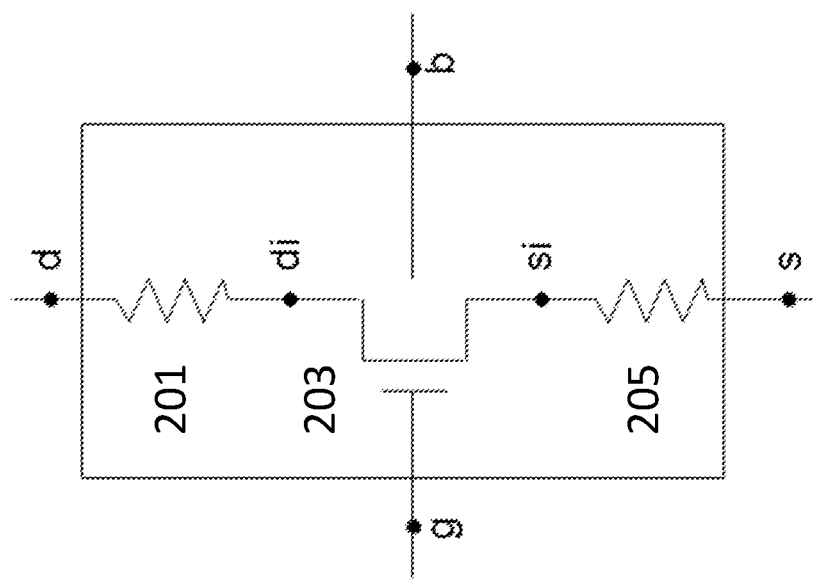
FIG. 2 illustrates a combined device with internal discrete components, according to an exemplary embodiment.

The testing system can reduce simulation time by reducing the number of calculations required to perform a simulation. For example, internal nodes can be reduced to only external terminal nodes, which would be simulated. As shown in FIG. 2, a device modeled with discrete components is shown. The device has resistors 201, 205, transistor 203, internal nodes di, si, and terminal nodes g, s, b, d (e.g., external nodes). As described herein, the testing system can reduce the internal nodes di, si of the devices so that only terminal nodes g, s, b, d would be simulated.

The following process explains how to simulate the state of a single, non-reduced discrete component. First, the testing system can formulate the ordinary differential equation (ODE) by starting with the Kirchhoff's Current Law (KCL) equations:

$$g(x)+q(x)=0,$$

where g (x), q(x) are current and charge vectors of the circuit, and x is the solution vector.

Then the testing system can discretize the ODE for time $t_k$. An exemplary method for discretizing the ODE is to use the trapezoidal rule at time $t_k$.

$$g+\alpha_0 q+\beta_1 g_{k-1}+\alpha_1 q_{k-1}=0,$$

where $\alpha_0$, $\alpha_1$, and $\beta_1$ are integration coefficients, g, q are discretized current and charge vectors at time $t_k$, and $g_{k-1}$, $q_{k-1}$ are discretized current and charge vectors at time $t_{k-1}$.

Finally, the testing system can solve the discretized equations using Newton's iteration:

$$(G+\alpha_0 C)\Delta x=-(g+\alpha_0 q+\beta_1 g_{k-1}+\alpha_1 q_{k-1}),$$

$$x=x+\Delta x,$$

where G, C are conductance and capacitance matrices, and x, $\Delta x$ are the solution and delta solution of Newton's iteration, respectively.

To reduce the circuit-level matrix size, the testing system can eliminate the device internal nodes to simulate only terminal nodes. For a device with internal nodes, divide the device's solution, x, into an internal solution $x_1$ and terminal solution $x_2$.

$$\begin{bmatrix} A_{11} & A_{12} \\ A_{21} & A_{22} \end{bmatrix}\begin{bmatrix} \Delta x_1 \\ \Delta x_2 \end{bmatrix}=\begin{bmatrix} r_1 \\ r_2 \end{bmatrix},$$

where $$\begin{bmatrix} A_{11} & A_{12} \\ A_{21} & A_{22} \end{bmatrix}=\begin{bmatrix} G_{11}+\alpha_0 C_{11} & G_{12}+\alpha_0 C_{12} \\ G_{21}+\alpha_0 C_{21} & G_{22}+\alpha_0 C_{22} \end{bmatrix}, \text{ and}$$

$$\begin{bmatrix} r_1 \\ r_2 \end{bmatrix}=-\begin{bmatrix} g_1+\alpha_0 q_1+\beta_1 g_{k-1,1}+\alpha_1 q_{k-1,1} \\ g_2+\alpha_0 q_2+\beta_1 g_{k-1,2}+\alpha_1 q_{k-1,2} \end{bmatrix}.$$

Next, the testing system can solve the terminal and internal nodes:

$$(A_{22}-A_{21}A_{11}^{-1}A_{12})\Delta x_2=-(g_2-A_{21}A_{11}^{-1}g_1)-\alpha_0(q_2-A_{21}A_{11}^{-1}q_1)-\beta_1(g_{k-1,2}-A_{21}A_{11}^{-1}g_{k-1,1})-\alpha_1(q_{k-1,2}-A_{21}A_{11}^{-1}q_{k-1,1}),$$

$$\Delta x_1=A_{11}^{-1}r_1-A_{11}^{-1}A_{12}\Delta x_2,$$

where, $A_{11}^{-1}=(G_{11}+\alpha_0 C_{11})^{-1}$.

The testing system has not made any approximation up to now. Every time $\alpha_0$ changes, we need to re-compute $A_{11}^{-1}$, even if $G_{11}$ and $C_{11}$ do not change. The computational cost is high. Therefore, embodiments of this disclosure include methods for reducing those high computational costs.

Below is one exemplary method for reducing the number of nodes to simulate in an integrated circuit to reduce computational costs. The testing system can make approximations based on predetermined criteria, such as whether the RC time constant is below a certain threshold, e.g., 8 millisecond-1 femtosecond.

$$(\hat{G}_{22}+\alpha_0 \hat{C}_{22})\Delta x_2=-(g_2-G_{21}G_{11}^{-1}g_1)-\alpha_0(q_2-G_{21}G_{11}^{-1}q_1)-\beta_1(g_{k-1,2}-G_{21}G_{11}^{-1}g_{k-1,1})-\alpha_1(q_{k-1,2}-G_{21}G_{11}^{-1}q_{k-1,1})+\alpha_0(C_{21}-G_{21}G_{11}^{-1}C_{11})G_{11}^{-1}g_1,$$

where matrices $\hat{G}_{22}$, $\hat{C}_{22}$ are reduced to the device terminal size. In this way, the testing system can reduce the overall circuit-level matrix size. Furthermore, the testing system can reuse the previously reduced matrices when the state of the system is sufficiently close to the state at a previous time. For example, if the node voltage change is within a predetermined threshold of a prior time, e.g., 1 mV-100 mV, then the testing system can reuse a previous matrix.

Below are detailed derivations of this exemplary reduction embodiment as performed by a testing system. Note that the right hand side of Newton's equation, which is divided into internal and terminal parts:

$$r=\begin{bmatrix} r_1 \\ r_2 \end{bmatrix}=-\begin{bmatrix} g_1+\alpha_0 q_1+\beta_1 g_{k-1,1}+\alpha_1 q_{k-1,1} \\ g_2+\alpha_0 q_2+\beta_1 g_{k-1,2}+\alpha_1 q_{k-1,2} \end{bmatrix}$$

Next, the testing system can approximate the terminal charge by mapping the internal charge and past history to terminal nodes by using a projection matrix:

$$M \equiv [\, m \quad I\,] = [\,-G_{21}G_{11}^{-1} \quad I\,],$$

$$\begin{bmatrix} r_1 \\ r_2 \end{bmatrix}=-\begin{bmatrix} g_1 \\ g_2 \end{bmatrix}-\alpha_0 M\begin{bmatrix} q_1 \\ q_2 \end{bmatrix}-\beta_1 M\begin{bmatrix} g_{k-1,1} \\ g_{k-1,2} \end{bmatrix}-\alpha_1 M\begin{bmatrix} q_{k-1,1} \\ q_{k-1,2} \end{bmatrix}=$$

-continued $$-\begin{bmatrix} g_1 \\ g_2 + \alpha_0(q_2 + mq_1) + \beta_1(g_{k-1,2} + mg_{k-1,1}) + \alpha_1(q_{k-1,2} + mq_{k-1,1}) \end{bmatrix}.$$

Next, the testing system can formulate Newton's equation:

$$\begin{bmatrix} G_{11} & G_{12} \\ G_{21} + \alpha_0(C_{21} + mC_{11}) & G_{22} + \alpha_0(C_{22} + mC_{21}) \end{bmatrix} \begin{bmatrix} \Delta x_1 \\ \Delta x_2 \end{bmatrix} = \begin{bmatrix} r_1 \\ r_2 \end{bmatrix},$$

where $m = [-G_{21}G_{11}^{-1}]$

After reduction, we obtain the approximation reduction $$(\hat{G}_{22}+\alpha_0\hat{C}_{22})\Delta x_2 = -(g_2-G_{21}G_{11}^{-1}g_1)-\alpha_0(q_2-G_{21}G_{11}^{-1}q_1)-\beta_1(g_{k-1,2}-G_{21}G_{11}^{-1}g_{k-1,1})-\alpha_1(q_{k-1,2}-G_{21}G_{11}^{-1}q_{k-1,1})+\alpha_0(C_{21}-G_{21}G_{11}^{-1}C_{11})G_{11}^{-1}g_1,$$

$$\Delta x_1 = G_{11}^{-1}g_1 - G_{11}^{-11}G_{12}\Delta x_2.$$

To compare the non-approximation reduction and the approximation reduction, rewrite the equation using non-approximation reduction:

$$(A_{22}-A_{21}A_{11}^{-1}A_{12})\Delta x_2 = -(g_2-A_{21}A_{11}^{-1}g_1)-\alpha_0(q_2-A_{21}A_{11}^{-1}q_1)-\beta_1(g_{k-1,2}-A_{21}A_{11}^{-1}g_{k-1,1})-\alpha_1(q_{k-1,2}-A_{21}A_{11}^{-1}q_{k-1,1})$$

and the approximation reduction:

$$(\hat{G}_{22}+\alpha_0\hat{C}_{22})\Delta x_2 = -(g_2-G_{21}G_{11}^{-1}g_1)-\alpha_0(q_2-G_{21}G_{11}^{-1}q_1)-\beta_1(g_{k-1,2}-G_{21}G_{11}^{-1}g_{k-1,1})-\alpha_1(q_{k-1,2}-G_{21}G_{11}^{-1}q_{k-1,1})+\alpha_0(C_{21}-G_{21}G_{11}^{-1}C_{11})G_{11}^{-1}g_1.$$

Compare the right-hand-side (RHS) of above two equations. The RHS of the approximation reduction has one extra term $\alpha_0(C_{21}-G_{21}G_{11}^{-1}C_{11})G_{11}^{-1}g_1$. This extra term is zero after Newton's iteration converges. The remaining terms in the two equations are similar, except that in approximation reduction, $A_{11}$ is approximated by $G_{11}$. Note that $A_{11}=G_{11}+\alpha_0C_{11}$, the approximation algorithm is accurate when $G_{11}>>\alpha_0C_{11}$.

Based on the relationship of internal and terminal delta solution in approximation reduction, $$\Delta x_1 = G_{11}^{-1}g_1 - G_{11}^{-1}G_{12}\Delta x_2,$$

define another projection matrix $$N \equiv \begin{bmatrix} n \\ I \end{bmatrix} = \begin{bmatrix} -G_{21}G_{11}^{-1} \\ I \end{bmatrix},$$

and obtain $$\hat{G}_{22} = MGN$$
$$= [-G_{21}G_{11}^{-1}\ I] \begin{bmatrix} G_{11} & G_{12} \\ G_{21} & G_{22} \end{bmatrix} \begin{bmatrix} -G_{11}^{-1}G_{12} \\ I \end{bmatrix}$$
$$= (G_{22} - G_{21}G_{11}^{-1}G_{12}),$$

$$\hat{C}_{22} = MCN$$
$$= [-G_{21}G_{11}^{-1}\ I] \begin{bmatrix} C_{11} & C_{12} \\ C_{21} & C_{22} \end{bmatrix} \begin{bmatrix} -G_{11}^{-1}G_{12} \\ I \end{bmatrix}$$
$$= (G_{22} - G_{21}G_{11}^{-1}C_{12} - C_{21}G_{11}^{-1}G_{21} + G_{21}G_{11}^{-1}C_{11}G_{11}^{-1}G_{12}).$$

Next is an exemplary generalized matrix reduction method. The previously described device reduction algorithm is a special case when, $$M=[mI]=[-G_{21}G_{11}^{-1}I]$$

If the testing system does not assume $m=[-G_{21}G_{11}^{-1}]$, the testing system can use a generalized reduction method. One difference is how the testing system maps internal information to terminal nodes. The right side projection matrix can be the same:

$$n=[-G_{11}^{-1}G_{12}]$$

The rest of the derivation is similar.

More generally, we define a general projector, $$M=[mI].$$

and apply it to the KCL equation $$M\begin{bmatrix} r_1 \\ r_2 \end{bmatrix} = 0.$$

In addition, we force the delta solution to satisfy following relationship, $$\Delta x_1 = n\Delta x_2.$$

We obtain the implicit right projector $$N \equiv \begin{bmatrix} n \\ I \end{bmatrix}.$$

The new system equation of the general method is $$(\hat{G}_{22}+\alpha_0\hat{C}_{22})\Delta x_2 = r_2 + mr_1,$$

where, $$\hat{G}_{22}=MGN, \hat{C}_{22}=MCN.$$

Figure 3:
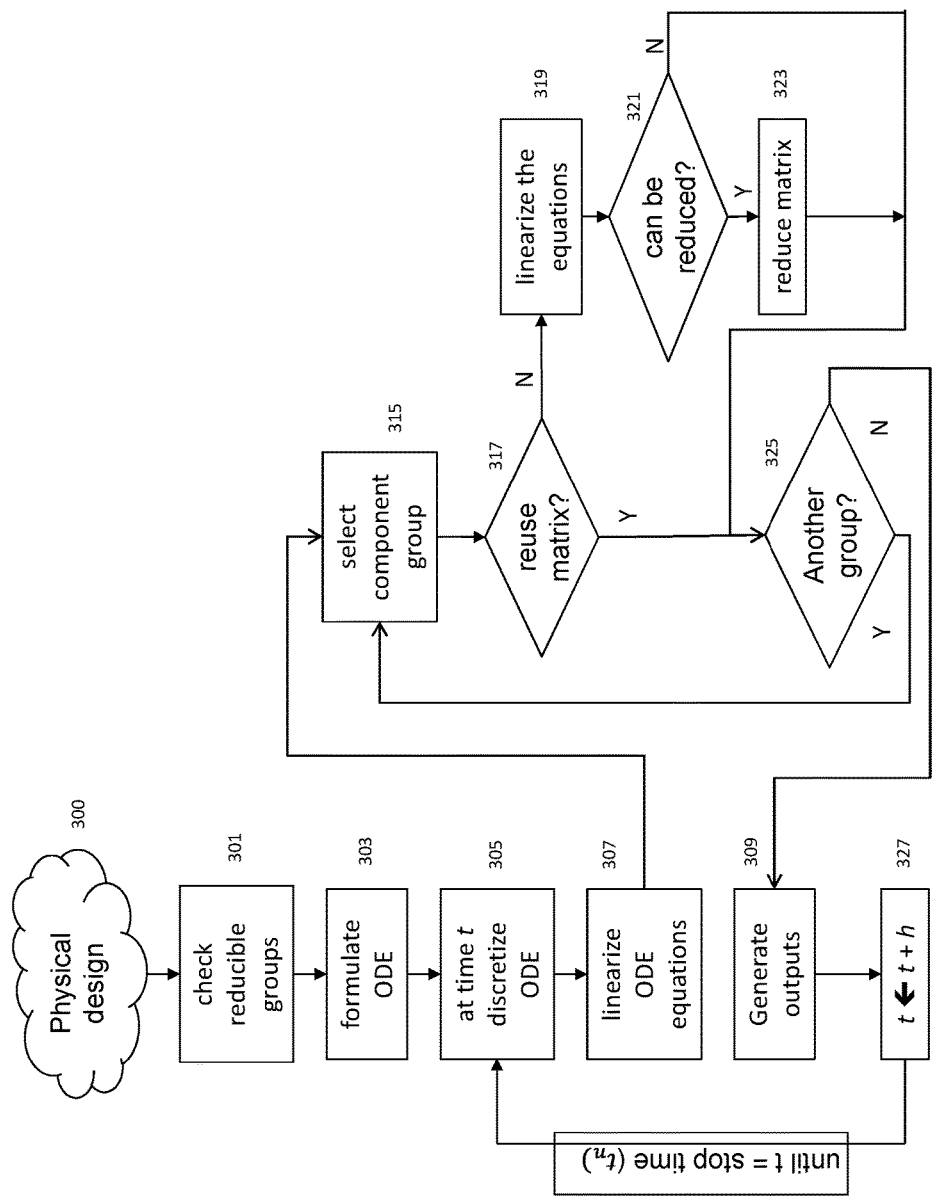
FIG. 3 illustrates a process for reducing the number of discrete components in a design of an integrated circuit, according to an exemplary embodiment.

With this exemplary device reduction algorithm, the testing system can apply it to a physical world simulation, as described in FIG. 3. FIG. 3 illustrates an embodiment of a process for reducing the number of discrete components in a design of an integrated circuit as implemented by the testing system described above. The process first looks at the physical design 300 of the integrated circuit to be tested. The physical design can be the discrete components used in the integrated circuits at various levels of hierarchy. One level of hierarchy can be relatively high-level block diagrams of discrete components coupled together to form an integrated circuit. Each discrete component can have various programmable characteristics, such as threshold voltages, resistances, capacitances, inductances, and an RC time constant. Alternatively, the devices can be laid-out as they will actually appear on an integrated circuit with specific etchings for wires and CMOS circuits. In either case, each device will have operational characteristics simulated in the testing environment.

Step 301 includes checking for reducible groups. Groups to check can be selected by using predetermined number of discrete components, though the testing system may use any number of discrete components. In one embodiment, the testing system can look at groups of 10 devices to see whether they are reducible. The testing system can use one or more predefined criteria to determine whether the group of discrete components may be reduced into a combined device. As explained above, each device can have an associated RC time constant. One criterion for assessing whether a group is reducible is by summing RC time constants of the group to see whether the sum is below a particular threshold signifying that the group is reducible. Other criteria include how discrete components interact with one another and whether feedback loops make combinations difficult. More elaborate criteria might include comparing transfer functions of the original and reduced component collections and accepting those as reducible whose approximate transfer functions are sufficiently aligned, for example, within a 1% relative accuracy of each other. This can be accomplished, for example, by comparing one or more outputs for respective input(s) of each transfer function to ensure that they are sufficiently aligned, and thus the reduced transfer function is within the predetermined relative accuracy.

Figure 4:
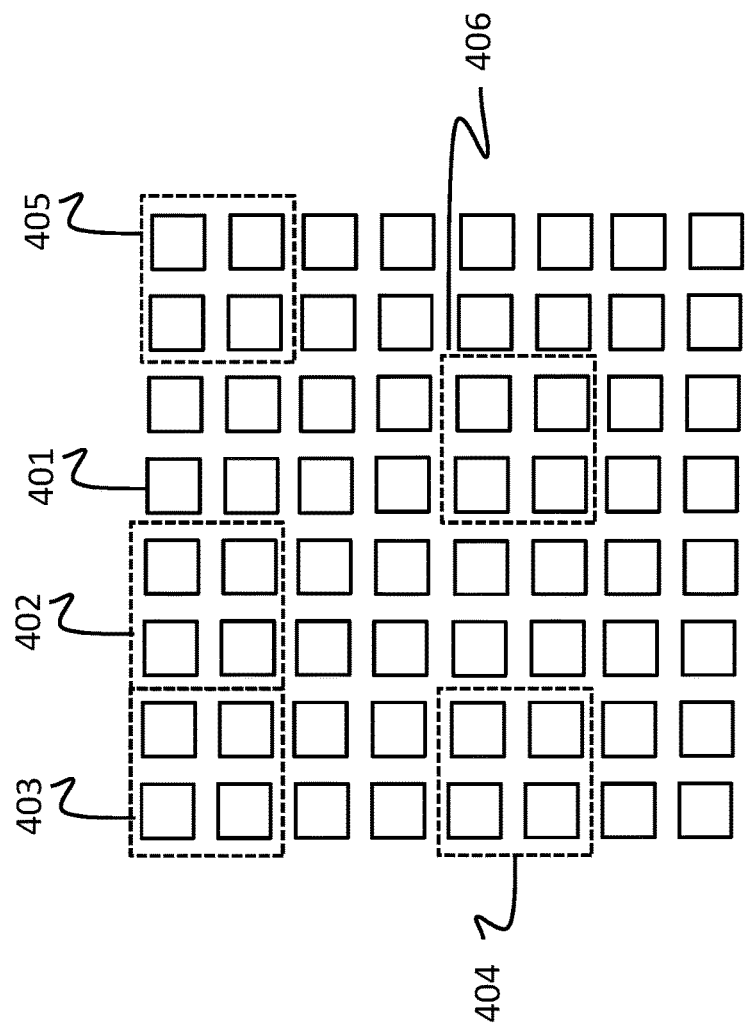
FIG. 4 illustrates an integrated circuit with discrete components, according to an exemplary embodiment.

FIG. 4 illustrates an exemplary result of step 301. FIG. 4 illustrates an 8×8 grid of discrete components 401. In this embodiment, the testing system checks whether each 2×2 group, starting with group 403 is reducible. In this example, the testing system calculates the RC time constant, and perhaps other parameters, and determines that they meet the predetermined criteria to reduce the group. In response, the testing system can set a flag identifying that group of discrete components as being reducible. Each component can have a parameter identifying its group number (e.g., 203), and a parameter (e.g., binary flag) of whether the group is reducible. The parameter of whether the group is reducible can be a single flag for the whole group or multiple flags— one for each discrete component of the group. In the example of FIG. 4, groups 402, 403, 404, 405, 406 are reducible, while the remainder of discrete components 401 are not reducible because they do not meet the one or more predefined criteria for being reduced.

Step 303 includes formulating ODEs that model the behavior of each discrete component 401. The testing system can formulate the ODE by starting with the KCL equations:

$$g(x)+\dot{q}(x)=0;$$

where g (x), q(x) are current and charge vectors of the circuit, and x is the solution vector.

Then the testing system can discretize the ODE for each discrete component at time $t_0$ in step 305, which is the first step in a loop that simulates the state of every discrete component or combined device at a particular time. An exemplary method for discretizing the ODE can use the trapezoidal rule at time $t_k$, which is $t_0$ in the first step and ends at $t_n$, the stop time.

$$g+\alpha_0 q+\beta_1 g_{k-1}+\alpha_1 q_{k-1}=0;$$

where $\alpha_0$, $\alpha_1$, and $\beta_1$ are integration coefficients, g, q are discretized current and charge vectors at time $t_k$, and $g_{k-1}$, $q_{k-1}$ are discretized current and charge vectors at time $t_{k-1}$.

To simulate the state of every component or device, the testing system can then linearize the ODE equations in step 307. This is done by selecting a component group in step 315, and performing steps 315-325 for each component group or discrete component. For example, the testing system can start by selecting component group 403 in FIG. 4. In step 317, the testing system determines whether it can reuse the matrix from the previous iteration. Because this is the first iteration, there is no previous matrix. Thus, the testing system moves to step 319 and linearizes the ODEs of the discrete components in the group, where the ODE's model the behavior of each discrete component.

It can be time-consuming to solve Newton's equation for each of these discrete components. Solving Newton's equation for each internal node constitutes a large portion of the solution vector-matrix factorization and solution checking can be time-consuming due to the large size of the matrices with internal nodes. Therefore, the testing system may decide whether to reduce internal nodes and therefore the device-level matrix size to its terminal size in step 321. To do this, the testing system can determine whether the group of discrete components can be reduced into a combined, current device using one or more second predefined criteria by, for example, summing the RC time constants of all of the discrete components to see whether they are less than a predetermined value. Alternatively, the testing system can check to see whether a flag is set indicating that the group of discrete components can be reduced. If the discrete components can be reduced based on the one or more second predefined criteria, the testing system proceeds to step 323. In some embodiments, the testing system can determine at runtime whether to combine a group of discrete components at every time $t_n$. In alternative embodiments, the system can combine every discrete component at every time $t_n$, based on an initial assessment that the group of discrete components was reducible in step 301. However, the characteristics of the combined device may change due to the state of the combined device's external terminals.

In step 323, the testing system can reduce matrices G, C (e.g., conductance and capacitance matrices) into matrices $\hat{G}$, $\hat{C}$, which are reduced to the combined device terminal size of one or more devices. The testing system can do so by, for example, using the previously described methodology, reproduced below for convenience:

$$(\hat{G}_{22}+\alpha_0\hat{C}_{22})\Delta x_2 = -(g_2-G_{21}G_{11}^{-1}g_1)-\alpha_0(q_2-G_{21}G_{11}^{-1}q_1)-\beta_1(g_{k-1,2}-G_{21}G_{11}^{-1}g_{k-1,1})-\alpha_1(q_{k-1,2}-G_{21}G_{11}^{-1}q_{k-1,1})+\alpha_0(C_{21}-G_{21}G_{11}^{-1}C_{11})G_{11}^{-1}g_1.$$

In this way, the testing system can reduce the current group of discrete components into a combined, current device having a reduced overall circuit-level matrix size.

After step 323, or if the discrete components cannot be reduced, then the testing system proceeds to step 325 to determine whether there is another group or discrete component to analyze. If there is, the testing system moves to step 315 to repeat the loop for another group. In the example of FIG. 4, the testing system could select component group 402 after component group 403, then proceed to various discrete components 401 that were not reducible, and other component groups that were, such as component groups 404, 405, 406, until each component group and non-reducible discrete component is processed through steps 315-325.

Figure 5:
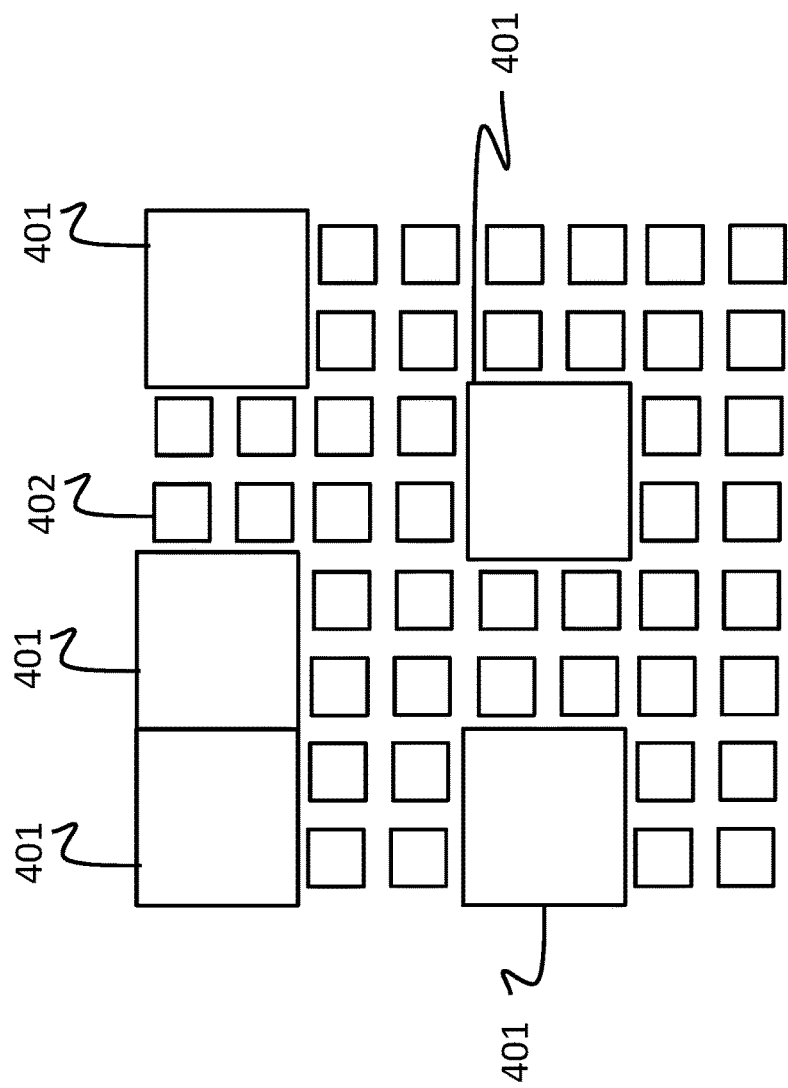
FIG. 5 illustrates an integrated circuit with discrete components and combined devices, according to an exemplary embodiment.

If all groups have been processed, the testing system moves to step 309 to complete the simulation at time $t_0$ and generate the output for each node of the testing system, except for nodes that were reduced. FIG. 5 provides an illustration of the integrated circuit of FIG. 4 after being reduced. Each square illustrates a separate discrete component or combined device to simulate at the current time period. In this example, each of groups 402, 403, 404, 405, and 406 was reduced, thereby eliminating internal nodes from the simulation for those groups. Note that at other times or in other embodiments, the number of reduced groups may be higher or lower depending on the criteria used to determine whether to reduce groups and the size of the groups. Not having to simulate the state of reduced nodes can save a significant amount of simulation time. Finally, the time t is incremented by one unit of time, such as one picosecond, but can vary depending on the resolution of the simulation.

Although certain illustrative, non-limiting exemplary embodiments have been presented, various changes, substitutions, permutations, and alterations can be made without departing from the scope of the appended claims. Further, the steps of the methods described herein may be carried out in any suitable order, or simultaneously where appropriate. Thus, the scope of the disclosure should not necessarily be limited by this description.

Unless specifically stated otherwise as apparent from the following discussion, it is appreciated that throughout the description, discussions utilizing terms such as "processing," "computing," "transmitting," "receiving," "determining," "displaying," "identifying," "presenting," "establishing," or the like, can refer to the action and processes of a data processing system, or similar electronic device that manipulates and transforms data represented as physical (electronic) quantities within the system's registers and memories into other data similarly represented as physical quantities within the system's memories or registers or other such information storage, transmission or display devices. The system or portions thereof may be installed on an electronic device.

The exemplary embodiments can relate to an apparatus for performing one or more of the functions described herein. This apparatus may be specially constructed for the required purposes, or it may comprise a general purpose computer selectively activated or reconfigured by a computer program stored in the computer. Such a computer program may be stored in a machine (e.g. computer) readable storage medium, such as, but is not limited to, any type of disk including floppy disks, optical disks, CD-ROMs and magnetic-optical disks, read only memories (ROMs), random access memories (RAMs) erasable programmable ROMs (EPROMs), electrically erasable programmable ROMs (EEPROMs), magnetic or optical cards, or any type of media suitable for storing electronic instructions, and each coupled to a bus.

The exemplary embodiments described herein are described as software executed on at least one server, though it is understood that embodiments can be configured in other ways and retain functionality. The embodiments can be implemented on known devices such as a personal computer, a special purpose computer, cellular telephone, personal digital assistant ("PDA"), a digital camera, a digital tablet, an electronic gaming system, a programmed microprocessor or microcontroller and peripheral integrated circuit element(s), and ASIC or other integrated circuit, a digital signal processor, a hard-wired electronic or logic circuit such as a discrete element circuit, a programmable logic device such as a PLD, PLA, FPGA, PAL, or the like. In general, any device capable of implementing the processes described herein can be used to implement the systems and techniques according to this disclosure.

The exemplary embodiments can relate to an apparatus for performing one or more of the functions described herein. This apparatus may be specially constructed for the required purposes or be selectively activated or reconfigured by computer executable instructions stored in non-transitory computer memory medium.

It is to be appreciated that the various components of the technology can be located at distant portions of a distributed network or the Internet, or within a dedicated secured, unsecured, addressed/encoded or encrypted system. Thus, it should be appreciated that the components of the system can be combined into one or more devices or co-located on a particular node of a distributed network, such as a telecommunications network. As will be appreciated from the description, and for reasons of computational efficiency, the components of the system can be arranged at any location within a distributed network without affecting the operation of the system. Moreover, the components could be embedded in a dedicated machine.

Furthermore, it should be appreciated that the various links connecting the elements can be wired or wireless links, or any combination thereof, or any other known or later developed element(s) that is capable of supplying or communicating data to and from the connected elements. The term "module" as used herein can refer to any known or later developed hardware, software, firmware, or combination thereof that is capable of performing the functionality associated with that element.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the disclosure (especially in the context of the following claims) are to be construed to cover both the singular and the plural, unless otherwise indicated herein or clearly contradicted by context. The terms "comprising," "having," "including," and "containing" are to be construed as open-ended terms (e.g., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Presently preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

We claim:

1. A method of reducing a number of discrete components of an integrated circuit comprising:
selecting, by a processor, a subset of discrete components inside a transistor device in the integrated circuit comprising a plurality of subsets of discrete components;
determining, by the processor, whether the subset of discrete components is reducible to a combined device based on one or more predefined criteria;
reducing, by the processor, the subset of discrete components into the combined device when the subset of discrete components is reducible; and
generating, by the processor, one or more outputs of the combined device and parasitic contributions of the combined device to the integrated circuit,
wherein a design of the integrated circuit is provided to a fabrication facility for fabrication, and wherein the fabrication forms an integrated circuit device.

2. The method according to claim 1, wherein the one or more predefined criteria include whether an RC time constant of the combined device is less than a predetermined threshold.

3. The method according to claim 1, wherein the subset of discrete components comprise discrete components from one metal oxide semiconductor (MOS) device.

4. The method according to claim 1, wherein the subset of discrete components comprise discrete components from a plurality of metal oxide semiconductor (MOS) devices.

5. The method according to claim 1, wherein the one or more predefined criteria include whether a first transfer function of the combined device is within a predetermined relative accuracy of a second transfer function of the discrete components.

6. The method according to claim 1 further comprising: selecting, by the processor, the plurality of subsets of discrete components of the integrated circuit based on a predetermined number of discrete components.

7. The method according to claim 1 further comprising: determining, by the processor using one or more third predefined criteria, whether to reuse a combined, current device for a subsequent time period; and
generating, by the processor, one or more outputs of the reused combined, current device.

8. The method according to claim 7, wherein the one or more third predetermined criteria comprise whether a voltage change of a node of the combined device exceeds a predetermined threshold.

9. The method according to claim 1, further comprising: determining, by the processor prior to runtime, whether subset of discrete components is reducible; and
setting, by the processor, at least one flag indicating that the subset of discrete components is reducible, if the determining step determines that the subset of discrete components is reducible, wherein the one or more predefined criteria include whether the at least one flag is set.

10. The method according to claim 1, further comprising: selecting a second subset of discrete components in the integrated circuit, wherein the second subset of discrete components includes a different number of discrete components relative to the subset of discrete components;
determining, by the processor, whether the second subset of discrete components is reducible to a second combined device based on one or more predefined criteria;
reducing, by the processor, the second subset of discrete components into the second combined device when the second subset of discrete components is reducible; and
generating, by the processor, one or more outputs of the second combined device and parasitic contributions of the combined device to the integrated circuit.

11. A method of reducing the number of discrete components of an integrated circuit comprising:
determining, by a processor, using one or more first predefined criteria, for a plurality of groups of discrete components, whether each group of discrete components can be reduced into a respective combined device;
setting, by the processor, at least one flag identifying that the group of discrete components is reducible into a combined device, if the group of discrete components meets the one or more first predefined criteria;
formulating, by the processor, a plurality of ordinary differential equations to model each discrete component of the integrated circuit;
discretizing, by the processor, each of the plurality of ordinary differential equations for a plurality of time periods, wherein for each of the plurality of time periods:
selecting, by the processor, for each of a second plurality of groups of discrete components, a current group of discrete components;
linearizing, by the processor, the plurality of ordinary differential equations that model a behavior of the current group of discrete components;
determining, by the processor, using one or more second predefined criteria, whether the current group of discrete components is reducible into a combined, current device;
wherein, when the current group of discrete components meets the one or more second predefined criteria:
reducing, by processor, the current group of discrete components into the combined, current device; and
generating, by the processor, one or more outputs of the combined, current device,
wherein a design of the integrated circuit is provided to a fabrication facility for fabrication, and wherein the fabrication forms an integrated circuit device.

12. The method according to claim 11, wherein the one or more predefined criteria include whether an RC time constant of the combined device is less than a predetermined threshold.

13. The method according to claim 11, further comprising: selecting, by the processor, the plurality of groups of discrete components of the integrated circuit based on a predetermined number of discrete components.

14. The method according to claim 11, further comprising: determining, by the processor, using one or more third predefined criteria, whether to reuse the combined, current device for a subsequent time period; and
generating, by the processor, one or more outputs of the reused combined, current device.

15. A system for reducing a number of discrete components of an integrated circuit, the system comprising:
a server comprising a processor configured to:
select a subset of discrete components inside a transistor device in an integrated circuit, wherein the integrated circuit comprises a plurality of subsets of discrete components;

determine whether the subset of discrete components is reducible to a combined device based on one or more predefined criteria;

reduce the subset of discrete components into the combined device when the subset of discrete components is reducible; and generate one or more outputs of the combined device and parasitic contributions of the combined device to the integrated circuit, wherein a design of the integrated circuit is provided to a fabrication facility for fabrication, and wherein the fabrication forms an integrated circuit device.

16. The system according to claim 15, wherein the one or more predefined criteria include whether an RC time constant of the combined device is less than a predetermined threshold.

17. The system according to claim 16, wherein the predetermined threshold is less than 8 milliseconds.

18. The system according to claim 16, wherein the predetermined threshold is less than 500 microseconds.

19. The system according to claim 15, wherein the processor is further configured to select the plurality of subsets of discrete components of the integrated circuit based on a predetermined number of discrete components.

20. The system according to claim 15, wherein the processor is further configured to:

determining, using one or more third predefined criteria, whether to reuse a combined, current device for a subsequent time period; and generating one or more outputs of the reused combined, current device.

* * * * *